(12) United States Patent
Shin et al.

(10) Patent No.: US 7,613,027 B2
(45) Date of Patent: Nov. 3, 2009

(54) SEMICONDUCTOR MEMORY DEVICE WITH DUAL STORAGE NODE AND FABRICATING AND OPERATING METHODS THEREOF

(75) Inventors: Sang-min Shin, Seoul (KR); Bon-jae Koo, Gyeonggi-do (KR); Yoon-dong Park, Gyeonggi-do (KR); Young-soo Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 11/907,183

(22) Filed: Oct. 10, 2007

(65) Prior Publication Data

US 2008/0087927 A1 Apr. 17, 2008

Related U.S. Application Data

(62) Division of application No. 11/353,084, filed on Feb. 14, 2006, now Pat. No. 7,297,997.

(30) Foreign Application Priority Data

Feb. 14, 2005 (KR) ...................... 10-2005-0012039

(51) Int. Cl.
*G11C 11/22* (2006.01)
(52) U.S. Cl. ............. 365/145; 365/185.18; 365/185.24; 257/296
(58) Field of Classification Search ................. 365/145, 365/149, 185.18, 185.24; 257/296, 311, 257/390
See application file for complete search history.

(56) References Cited

U.S. PATENT DOCUMENTS

| | | | | | |
|---|---|---|---|---|---|
| 3,513,365 | A | * | 5/1970 | Levi | 257/296 |
| 6,198,652 | B1 | * | 3/2001 | Kawakubo et al. | 365/145 |
| 6,200,898 | B1 | * | 3/2001 | Tu | 438/692 |
| 6,265,778 | B1 | * | 7/2001 | Tottori | 257/758 |
| 7,297,997 | B2 | * | 11/2007 | Shin et al. | 257/296 |
| 2004/0150028 | A1 | | 8/2004 | Horiguchi | |
| 2006/0267152 | A1 | | 11/2006 | Forbes | |

FOREIGN PATENT DOCUMENTS

KR 10-2001-0004385 1/2001
KR 10-2002-0039457 5/2002

OTHER PUBLICATIONS

Korean Office Action dated Sep. 22, 2006.

* cited by examiner

*Primary Examiner*—Gene N. Auduong
(74) *Attorney, Agent, or Firm*—Harness, Dickey & Pierce

(57) ABSTRACT

A semiconductor memory device with a dual storage node structure as well as methods of fabricating and operating such a device are provided. The semiconductor memory device includes a substrate, a first transistor formed on the substrate, a first storage node connected to a source region of the first transistor, a second storage node connected to a drain region of the first transistor, and a plate line commonly contacting the first storage node and the second storage node.

10 Claims, 12 Drawing Sheets

SEMICONDUCTOR MEMORY DEVICE WITH DUAL STORAGE NODE AND FABRICATING AND OPERATING METHODS THEREOF

PRIORITY STATEMENT

This is a Divisional Application of application Ser. No. 11/353,084, filed Feb. 14, 2006, now U.S. Pat. No. 7,297,997 which is an U.S. nonprovisional patent application claiming priority under 35 U.S.C. §119 to Korean Patent Application No. 2005-0012039, filed on Feb. 14, 2005, the contents of both of which are hereby incorporated by reference in their entirety.

BACKGROUND

1. Field of the Invention

The present invention relates to a semiconductor memory device and its fabrication and operation.

2. Description of the Related Art

Semiconductor memory devices can be classified into volatile memory devices and non-volatile memory devices. Volatile memory devices cannot retain data without a continuous supply of power. One representative volatile memory device is a dynamic random access memory (DRAM). On the other hand, non-volatile memory devices can retain stored data even without power. A flash memory is an example of a non-volatile memory device.

Conventional volatile and non-volatile memory devices are in a complementary relationship. Recently, attraction for a memory device having the advantages of both the volatile memory device and the non-volatile memory device is increasing. As a result, various types of memory devices have been introduced. FIG. 1 illustrates one conventional memory device introduced recently. This is a ferroelectric random access memory (FRAM) with a cob structure including a ferroelectric capacitor formed on a bit line.

Referring to FIG. 1, a transistor Tr is formed to a semiconductor substrate 10. A first interlayer insulating layer 18 is formed on the substrate 10. The first interlayer insulating layer 18 covers a gate 16 of the transistor Tr. A portion of the first interlayer insulating layer 18 is removed to form a first contact hole 20 exposing a source region 12 of the transistor Tr. A bit line 22 is formed on the first interlayer insulating layer 18, filling the first contact hole 20. A second interlayer insulating layer 24 covering the bit line 22 is formed on the first interlayer insulating layer 18 and the bit line 22. A second contact hole 25 exposing a drain region 14 is formed by penetrating the first interlayer insulating layer 18 and the second interlayer insulating layer 24. The second contact hole 25 is filled with a conductive plug 26. A bottom electrode 28 covering the conductive plug 26 is formed on the second interlayer insulating layer 24. The bottom electrode 28 is covered with a lead-zirconate-titanate (PZT) layer 30. The PZT layer 30 is covered with a top electrode 32. The bottom electrode 28, the PZT layer 30 and the top electrode 32 compose a ferroelectric capacitor. A third interlayer insulating layer 34 covering the ferroelectric capacitor is formed on the second interlayer insulating layer 24. A plate line 36 connected to the top electrode 32 is formed on the third interlayer insulating layer 34.

The memory device has the characteristics of volatile memory device having one transistor and one capacitor, that is, a DRAM structure, and replaces the capacitor with a ferroelectric capacitor, thereby also gaining advantages of a non-volatile memory device.

However, since the conventional memory device is capable of writing only one bit of data per cell, the integration scale of data per cell is limited.

SUMMARY OF THE INVENTION

Additional features and advantages of the present invention will be more fully apparent from the following detailed description of example embodiments, the accompanying drawings and the associated claims.

One or more embodiments of the present invention provide a semiconductor memory device with a dual storage node, which can write 2 bits of data per unit cell and thus enjoy an increased integration scale of the semiconductor memory device.

One or more embodiment of the present invention provide a fabricating method of such a semiconductor memory device.

One or more embodiment of the present invention provide an operating method of such a semiconductor memory device.

An embodiment of the present invention provides a semiconductor memory device including: a substrate; a first transistor formed on the substrate; a first storage node connected to a source region of the first transistor; a second storage node connected to a drain region of the first transistor; and a first plate line commonly contacting the first storage node and the second storage node.

Such a semiconductor memory device may further include: a second transistor formed on the substrate and sharing the source region and the first storage node; and a third transistor formed on the substrate and sharing the drain region and the second storage node.

Such a first storage node may contact a second plate line formed above the second transistor, and the first plate line and the second plate line may be electrically isolated.

Such a second storage node may contact a second plate line formed above the third transistor, and the first plate line and the second plate line above the third transistor may be electrically isolated.

Such first and second storage nodes may be capacitors or ferroelectric capacitors. Also, such first and second storage nodes may be phase change random access memory (PRAM) storage nodes or resistive RAM (RRAM) storage nodes.

Such storage nodes may include a material having a minimum resistance higher than the resistance of the first transistor when turned on.

An embodiment of the present invention provides a semiconductor memory device including: a substrate doped with a conductive impurity and including a plurality of doping regions spaced apart; a gate formed on the substrate between the doping regions; a plurality of storage nodes which are one to one connected to the doping regions; and a plurality of plate lines formed between the storage nodes, each plate being connected to two adjacent storage nodes, respectively.

Such storage nodes may be one of capacitors and ferroelectric capacitors.

Such storage nodes may be one of PRAM storage nodes and RRAM storage nodes.

Such storage nodes may include a material having a minimum resistance higher than the resistance of the first transistor when turned on.

An embodiment of the present invention provides a fabricating method of a semiconductor memory device, the method comprising: forming a transistor on a substrate; forming a first interlayer insulating layer covering the transistor on the substrate; forming a first contact hole and a second contact hole exposing a source region and a drain region of the transistor in the first interlayer insulating layer; filling the first contact hole and the second contact hole with a first conductive plug and a second conductive plug, respectively; and forming a first storage node and a second storage node respectively covering the first conductive plug and the second conductive plug on the first interlayer insulating layer.

Such first and second storage nodes may be formed to be isolated from each other, or formed so that one or more respective portions thereof are connected.

Such first and second storage nodes may be one of capacitors and ferroelectric capacitors.

Such first and second storage nodes may be one of PRAM storage nodes and RRAM storage nodes.

Such storage nodes may be formed of a material having a minimum resistance higher than the resistance of the first transistor when turned on.

An embodiment of the present invention provides an operating method of a semiconductor memory device, wherein the semiconductor memory device includes a substrate, a first transistor formed on the substrate, a first storage node connected to a source region of the first transistor, a second storage node connected to a drain region of the first transistor, and a plate line commonly contacting the first storage node and the second storage node, the operating method comprising: floating the drain region while maintaining the first transistor turned off; and generating a first electric potential difference between the source region of the first transistor and the plate line.

After the generating of the first electric potential difference, such an operating method may further include floating the source region while maintaining the first transistor turned off; and generating a second electric potential difference between the drain region and the plate line.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted.

The above and other features and advantages of the present invention will become more apparent by describing in detail the example embodiments thereof with reference to the attached drawings in which.

DETAILED DESCRIPTION OF EXAMPLE EMBODIMENTS

Figure 1:
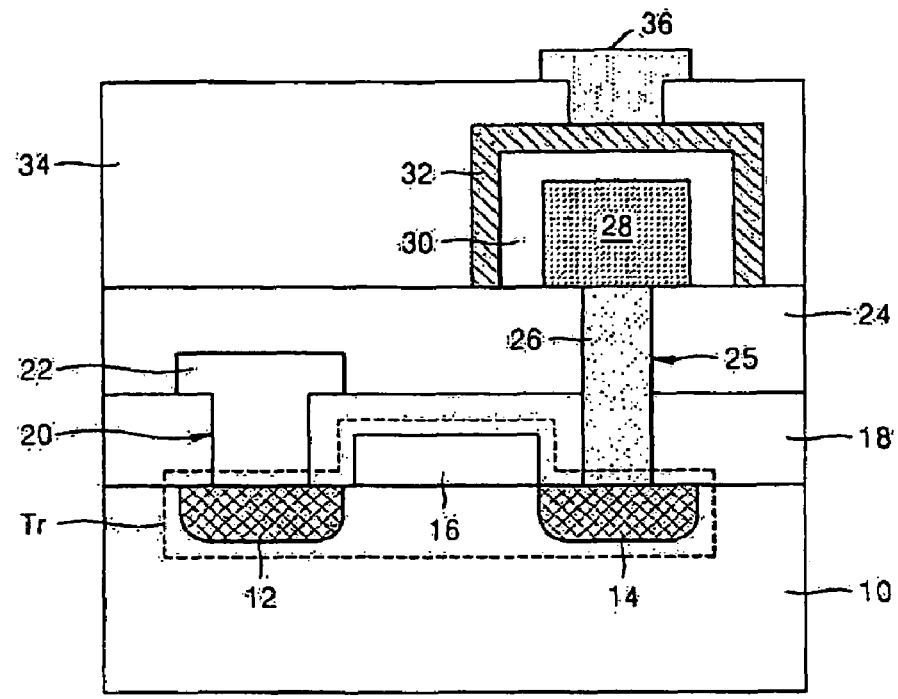
FIG. 1 is a sectional view of a conventional semiconductor memory device according to the Background Art.

A semiconductor memory device and fabricating and operating methods thereof according to example embodiments of the present invention will be described more fully with reference to the accompanying drawings. In the drawings, the thicknesses of layers and regions may be exaggerated for clarity.

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 2:
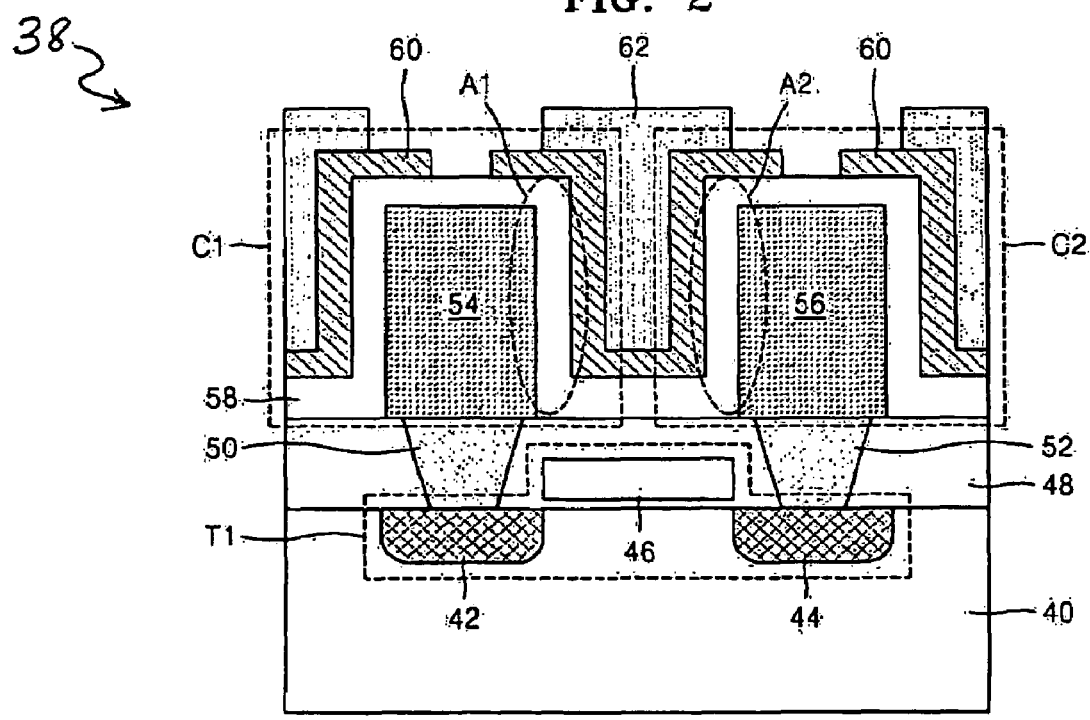
FIG. 2 is a sectional view of a semiconductor memory device with a dual storage node according to an example embodiment of the present invention.

A detailed description of a semiconductor memory device 38 with a dual storage node (hereinafter, referred to as a memory device 38) according to an example embodiment of the present invention will be provided. FIG. 2 is a sectional view of such a device 38.

Referring to FIG. 2, a substrate 40, for example a P-type substrate, is provided with a field effect transistor T1. The field effect transistor T1 includes source and drain regions 42 and 44 spaced apart from each other and doped with conductive impurities and a stacked gate structure 46 formed on a portion of the substrate 40 between the source region 42 and the drain region 44. The stacked gate structure 46 includes, e.g., a gate insulating layer and a gate electrode.

An interlayer insulating layer 48 covering the field effect transistor T1 is formed on the substrate 40. A first conductive plug 50 and a second conductive plug 52 pass through portions of the interlayer insulating layer 48 and are respectively connected to the source region 42 and the drain region 44. The first conductive plug 50 and the second conductive plug 52 may be conductive materials or semiconductive materials doped with conductive impurities. A first bottom electrode 54 and a second bottom electrode 56 exist on top of the interlayer insulating layer 48 and the first and second conductive plugs 50 and 52, respectively. The first bottom electrode 54 and the second bottom electrode 56 are spaced apart and respectively connected to the source region 42 and the drain region 44 through the first conductive plug 50 and the second conductive plug 52.

A dielectric layer 58 covering the first bottom electrode 54 and the second bottom electrode 56 is formed on the interlayer insulating layer 48. The dielectric layer 58 is a common dielectric layer. For example, the dielectric layer 58 may include a PZT layer and/or a bismuth titanate (BIT) layer, but may also include other typical dielectric materials.

A top electrode 60 is formed on the dielectric layer 58. The top electrode 60 surrounds the first bottom electrode 54 and the second bottom electrode 56. The top electrode 60 is discontinuous at the tops of the first bottom electrode 54 and the second bottom electrode 56. That is, the top electrode 60 is continuous on the dielectric layer 58 and up to the top of the first bottom electrode 54 and up to the top of the adjacent second bottom electrode 56, but is discontinuous in regions above the first bottom electrode 54 and the second bottom electrode 56.

Each of a plurality of plate lines 62 is placed on the top electrode 60. Such plate lines 62 can be electrically isolated from each other via switching components (not depicted). The plate lines 62 fill the spaces between the first bottom electrode 54 and the second bottom electrode 56. A group including the first bottom electrode 54, the dielectric layer 58 and the top electrode 60 defines a first capacitor C1 that is connected to the source region 42. Another group including the second bottom electrode 56, the dielectric layer 58, and the top electrode 60 define a second capacitor C2 that is connected to the drain region 44.

It should be noted that half of the top electrode 60 is included in the first capacitor C1 and the other half is included in the second capacitor C2. In view of the first capacitor C1 and the second capacitor C2, each of the first capacitor C1 and the second capacitor C2 includes the two top electrodes 60 separated from each other. When the power is supplied via plate lines 62, the power is supplied to both the first capacitor C1 and the second capacitor C2 because the top electrode 60 in contact with the plate lines 62 is also in contact with the first capacitor C1 and the second capacitor C2.

Figure 3:
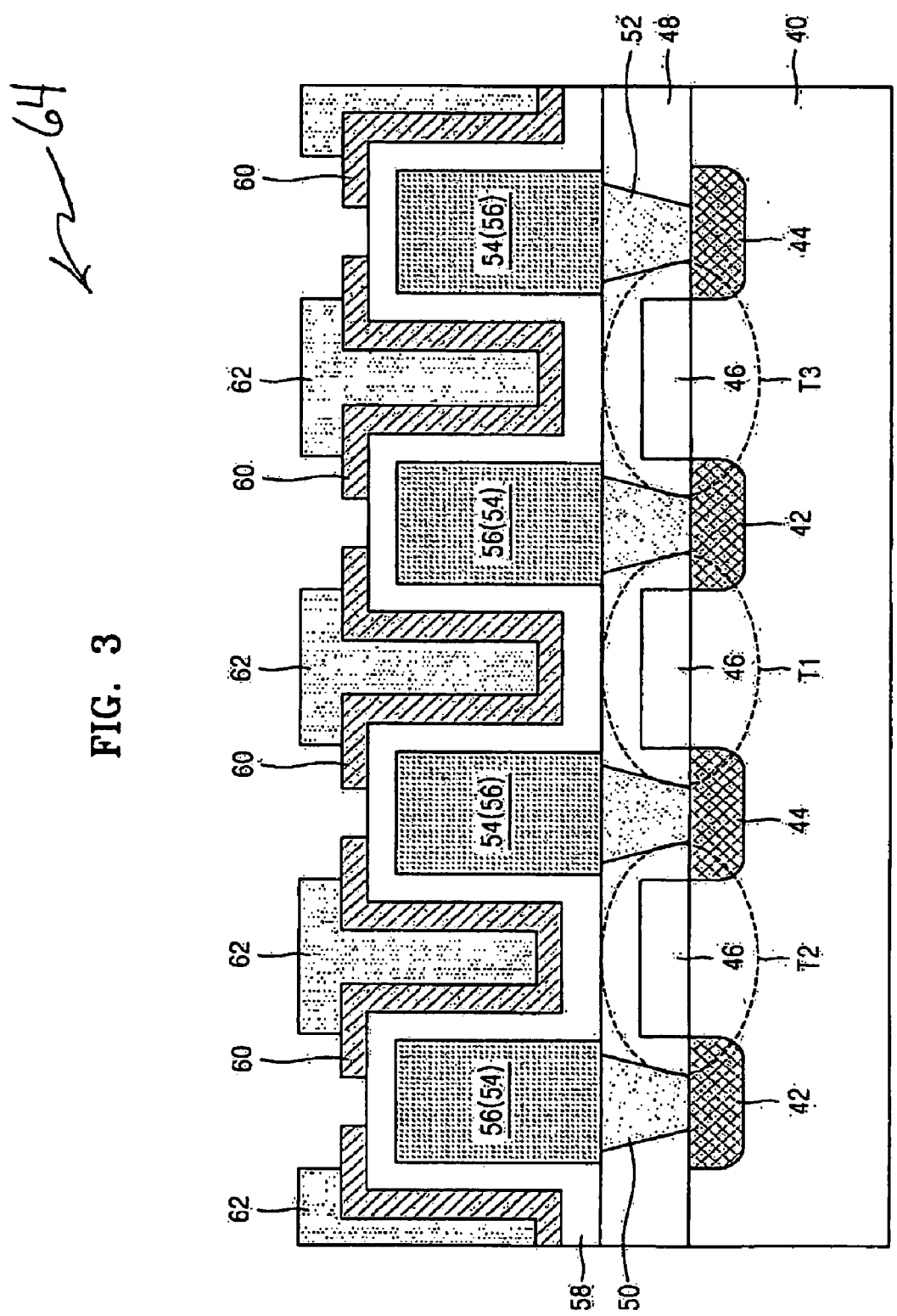
FIG. 3 is a schematic sectional view of a NAND memory device, according to an example embodiment of the present invention, based on the semiconductor memory device illustrated in FIG. 2.

FIG. 3 is a schematic view, according to an example embodiment of the present invention, of a NAND memory device 64 based upon the semiconductor device 38 illustrated in FIG. 2.

In FIG. 3, the NAND memory device 38 is formed by connecting a plurality of transistors in series to one bit line. Although the bit line is connected to the second transistor T2 and the third transistor T3, this connection is not illustrated in FIG. 3.

The field effect transistor T1 and its neighbors (a second transistor T2 and a third transistor T3 in FIG. 3) are all used to control the first capacitor C1. When the field effect transistor T1 is turned off, the second transistor T2 is turned on, and the third transistor T3 is turned off, data (e.g., '0' or '1') can be written to a first region A1 of the dielectric layer 58 included in the first capacitor C1. In FIG. 3, when the on/off states of the second transistor T2 and the third transistor T3 are inverted, data may be written to a second region A2 of the dielectric layer 58 included in the second capacitor C2. This operating method will be described in more detail.

The first capacitor C1 and the second capacitor C2 (connected respectively via the first conductive plug 50 and the second conductive plug 52 to the source region 42 and the drain region 44 of the field effect transistor T1) are one example of various storage nodes capable of storing data. Therefore, the first capacitor C1 and the second capacitor C2 may be replaced with other types of storage nodes. For example, the first capacitor C1 and the second capacitor C2 may be storage nodes that do not include a capacitor, such as resistive RAM or phase change RAM (PRAM) storage nodes, etc. In other words, the first and the second storage nodes may be adapted for use as the storage nodes in RAM-type memory devices such as PRAM, RRAM, etc. A detailed description of these various types of storage nodes will be provided later.

As illustrated in FIG. 2, a unit cell of the semiconductor memory device 38 includes one transistor and two storage nodes connected respectively to the source region and the drain region of the transistor. Again, as described above, the two storage nodes may be formed in various structures. Hence, the two-storage-node architecture of the semiconductor memory device 38 is capable of storing one bit of data in each storage node, and as a result, can store 2 bits of data (e.g., '00', '01', '10', or '11') per unit cell.

Figure 4:
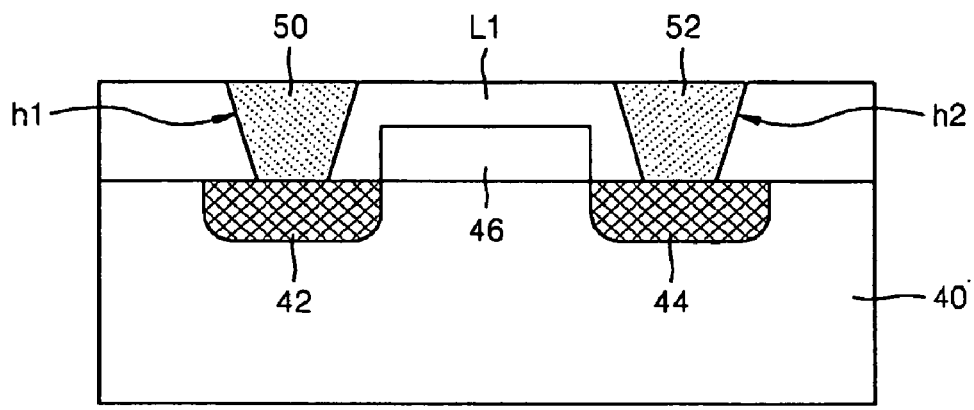
FIGS. 4 through 11 are sectional views depicting stages (most of which are intermediary) in a method, according to an example embodiment of the present invention, of manufacturing the semiconductor memory device illustrated in FIG. 2.
Figure 5:
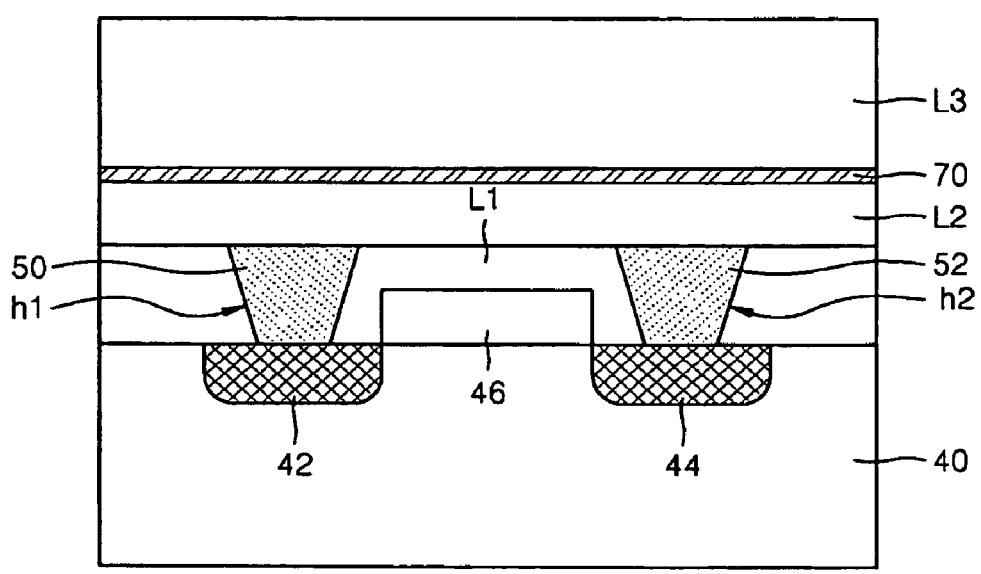
Figure 6:
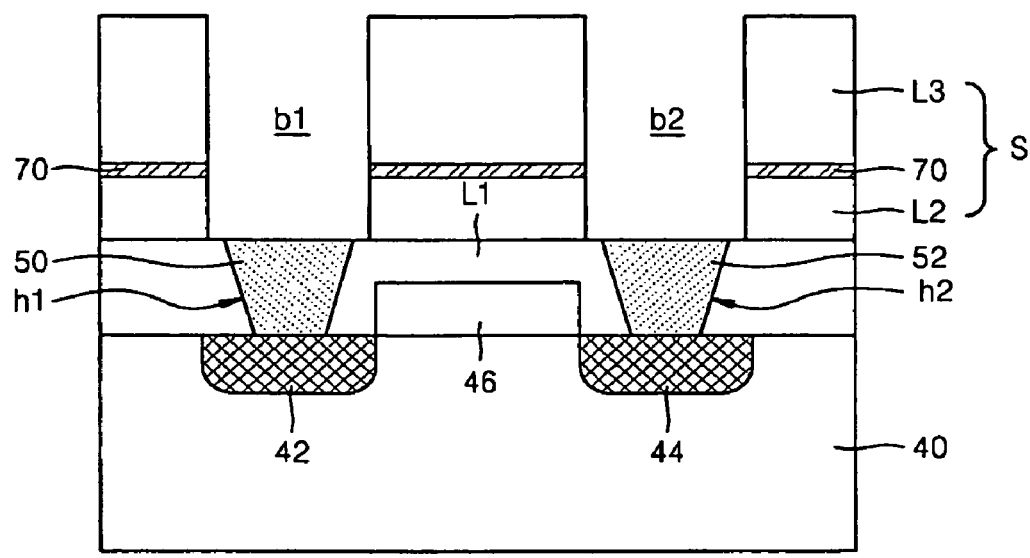

FIGS. 4-6 are sectional views depicting stages (most of which are intermediary) in a fabricating method, according to an example embodiment of the present invention, for the semiconductor memory device 38 illustrated in FIG. 2. Like reference numerals denote like elements even in different drawings.

Referring to FIG. 4, a source region 42 and a drain region 44 are formed in a doped substrate 40, for example, a P-type substrate. The source region 42 is spaced apart from the drain region 44. A stacked gate structure 46 is formed on the substrate 40 between the source region 42 and the drain region 44. The stacked gate structure 46, e.g., includes a gate insulating layer and a gate electrode, which are sequentially deposited. A group including the source region 42, the drain region 44 and the stacked gate structure 46 define a field effect transistor (hereinafter, referred to as a transistor). A first interlayer insulating layer L1 (corresponding to layer 48 of FIG. 2) covering the transistor is formed on the substrate 40 and then planarized. A first contact hole h1 and a second contact hole h2 are formed in the first interlayer insulating layer L1. The first contact hole h1 and the second contact hole h2 respectively expose the source region 42 and the drain region 44. Afterwards, a first conductive plug 50 and a second conductive plug 52 respectively fill the first and second contact holes h1 and h2.

Referring to FIG. 5, a second interlayer insulating layer L2, an etch barrier layer 70 and a third interlayer insulating layer L3 are sequentially formed on the first interlayer insulating layer L1. The etch barrier layer 70 protects the second interlayer insulating layer L2 in a subsequent wet etching process.

Referring to FIG. 6, a first via hole b1 exposing the first conductive plug 50 and a second via hole b2 exposing the second conducive plug 52 are formed in a stack structure S including the second interlayer insulating layer L2, the etch barrier layer 70 and the third interlayer insulating layer L3.

Figure 7:
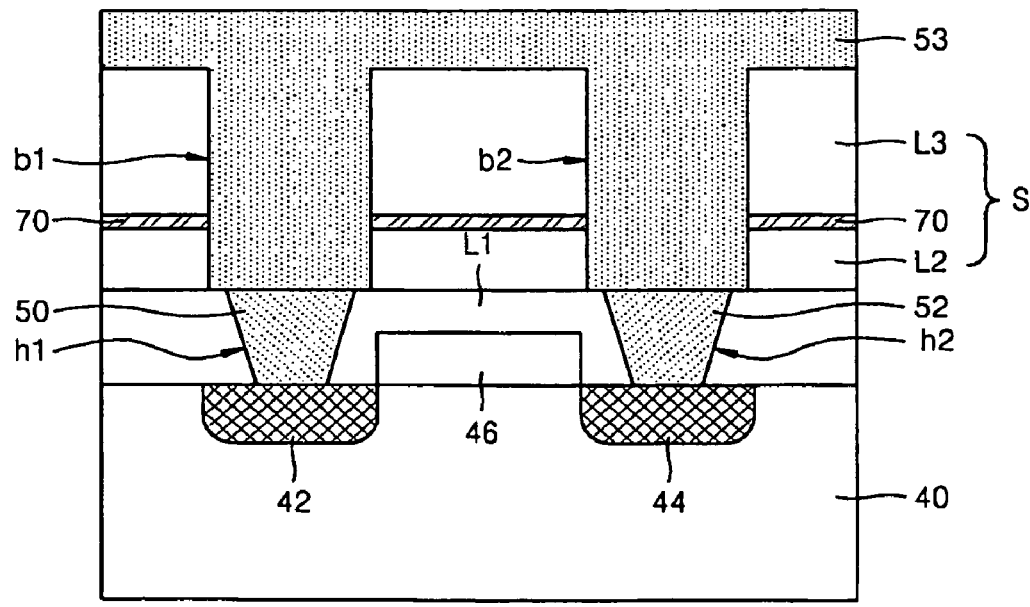

Referring to FIG. 7, a conductive layer 53 filling the first and second via holes b1 and b2 is formed on the stack structure S. A planarization process is performed on the conductive layer 53 until the stack structure S is exposed. As a result of the planarization process, as shown in FIG. 8, a first bottom electrode 54 filling the first via hole b1 and a second bottom electrode 56 filling the second via hole b2 are formed.

Figure 8:
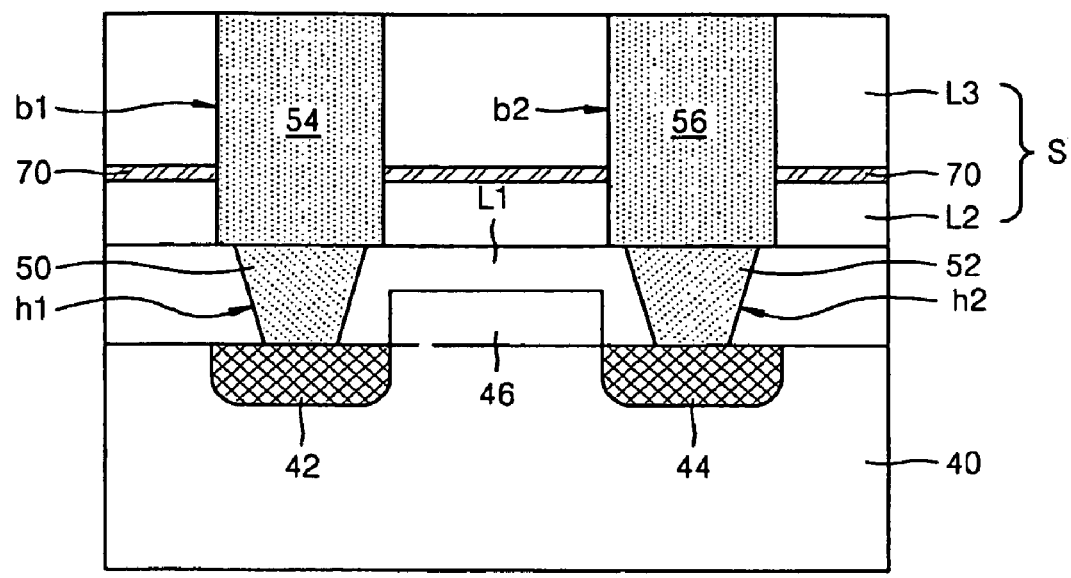
Figure 9:
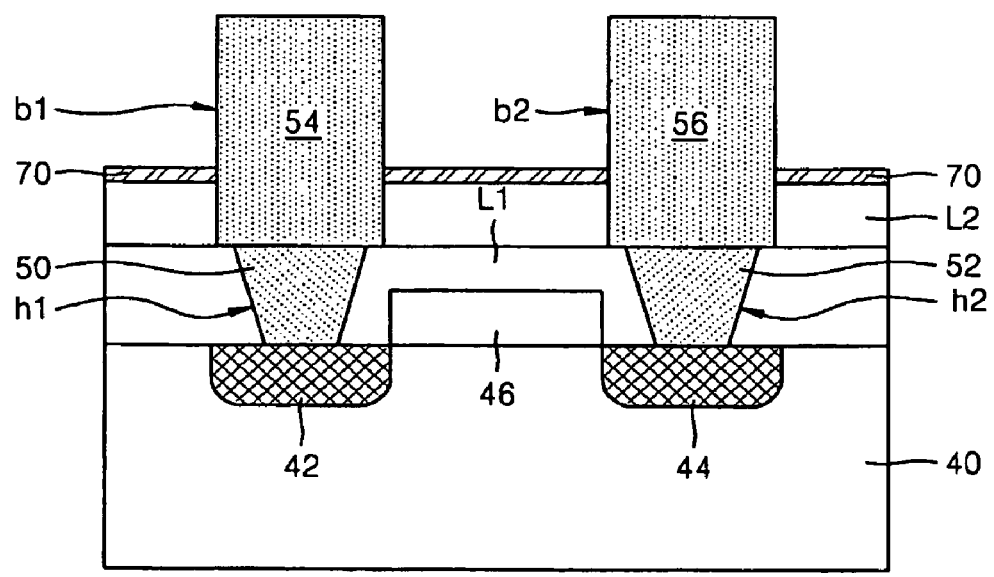

As illustrated in FIG. 9, the third interlayer insulating layer L3 between the first bottom electrode 54 and the second bottom electrode 56 is removed from the intermediary configuration shown in FIG. 8. The third interlayer insulating layer L3 may be removed using, e.g., an etching method. For example, a wet etching method using an etchant with a high etch selectivity ratio with respect to the etch barrier layer 70 may be employed to remove the third interlayer insulating layer L3. The wet etching exposes the sidewalls of the first bottom electrode 54 and the second bottom electrode 56. The etch barrier layer 70 may be removed after the removal of the third interlayer insulating layer L3, although it is not necessary to remove the etch barrier layer 70.

Figure 10:
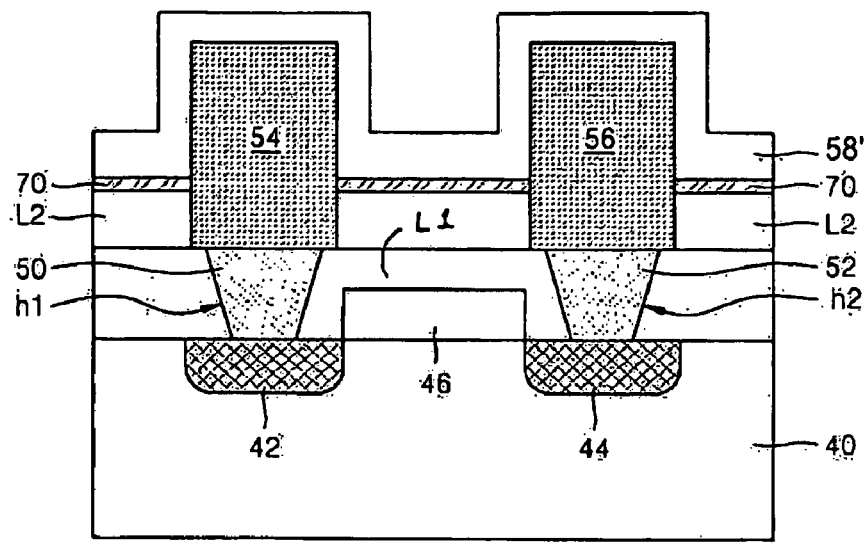

Referring to FIG. 10, a dielectric layer 58' covering the first and second bottom electrodes 54 and 56 is formed on the etch barrier layer 70. The dielectric layer 58' may be formed of, e.g., a low-k material such as silicon oxide, a ferroelectric material such as PZT or BIT, etc. Here, the dielectric layer 58', the etch barrier layer 70 (should it be retained) and the first interlayer insulating layer L1 correspond to the dielectric layer 58 in FIG. 2.

Figure 11:
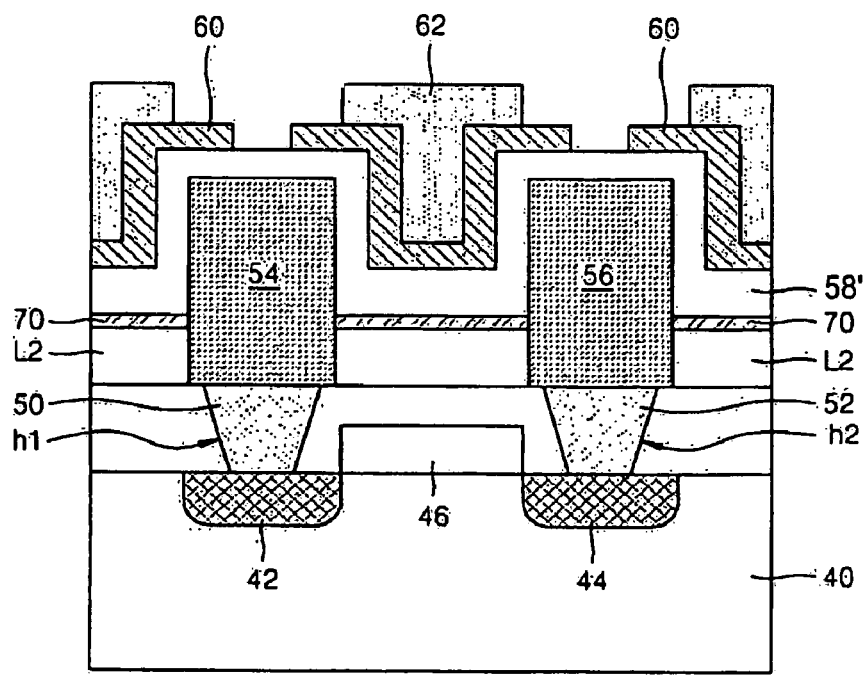

Referring to FIG. 11, a top electrode 60 is formed on the dielectric layer 58'. For example, the top electrode 60 can be formed to a thickness that does not completely fill the spaces between the first bottom electrode 54 and the second bottom electrode 56. Further, the top electrode 60 is formed to be discontinuous over the tops of (above) the first and second bottom electrodes 54 and 56 but continuous between the first bottom electrode 54 and the second bottom electrode 56. This type of the top electrode 60 can be easily obtained through a photolithography process. On the basis of the above-described operations, the memory device 38 (including one transistor and two capacitors C1 and C2 connected respectively with the source region 42 and the drain region 44 of the transistor) is provided. Afterwards, a plurality of plate lines 62 are formed on the top electrode 60, filling the spaces between first bottom electrode 54 and the second bottom electrode 56. Although not illustrated, a bit line connected to the source and drain regions 42 and 44 may be formed before or after the plate lines 62 are formed.

A detailed description of an operating method according to an example embodiment of the present invention, for a semiconductor memory device will now be provided. Particularly, a semiconductor memory device including a capacitor as a storage node, e.g., the two-storage-node architecture of the semiconductor memory device 38, is used as an example. The operating method set forth herein may also be applied to a memory device including a storage node that does not include a capacitor.

First, a write operation will be described. Like reference numerals denote like elements even in different drawings.

Figure 12:
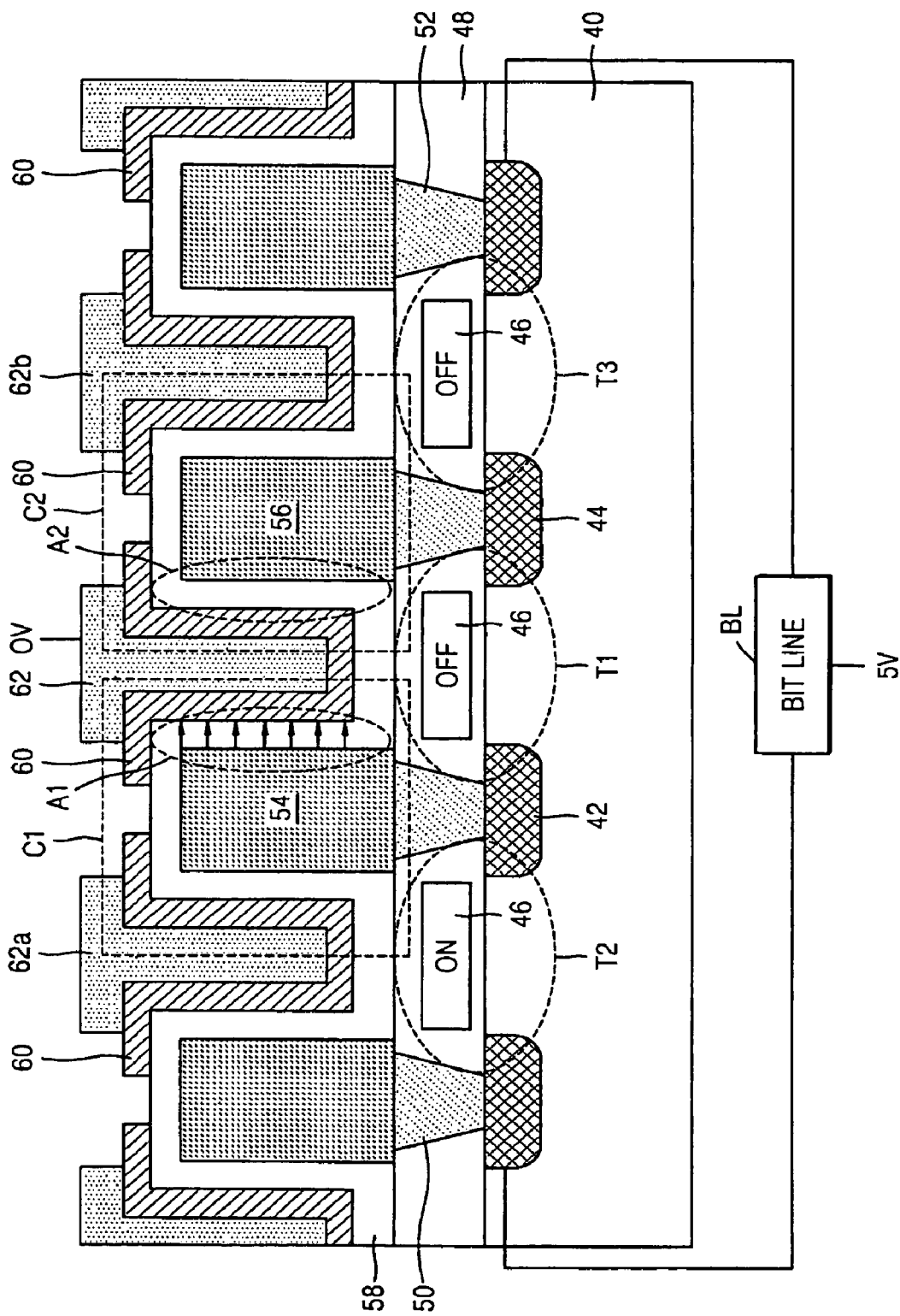
FIGS. 12 through 15 are sectional views illustrating examples of writing two bits of data to the NAND memory device in FIG. 3.
Figure 13:
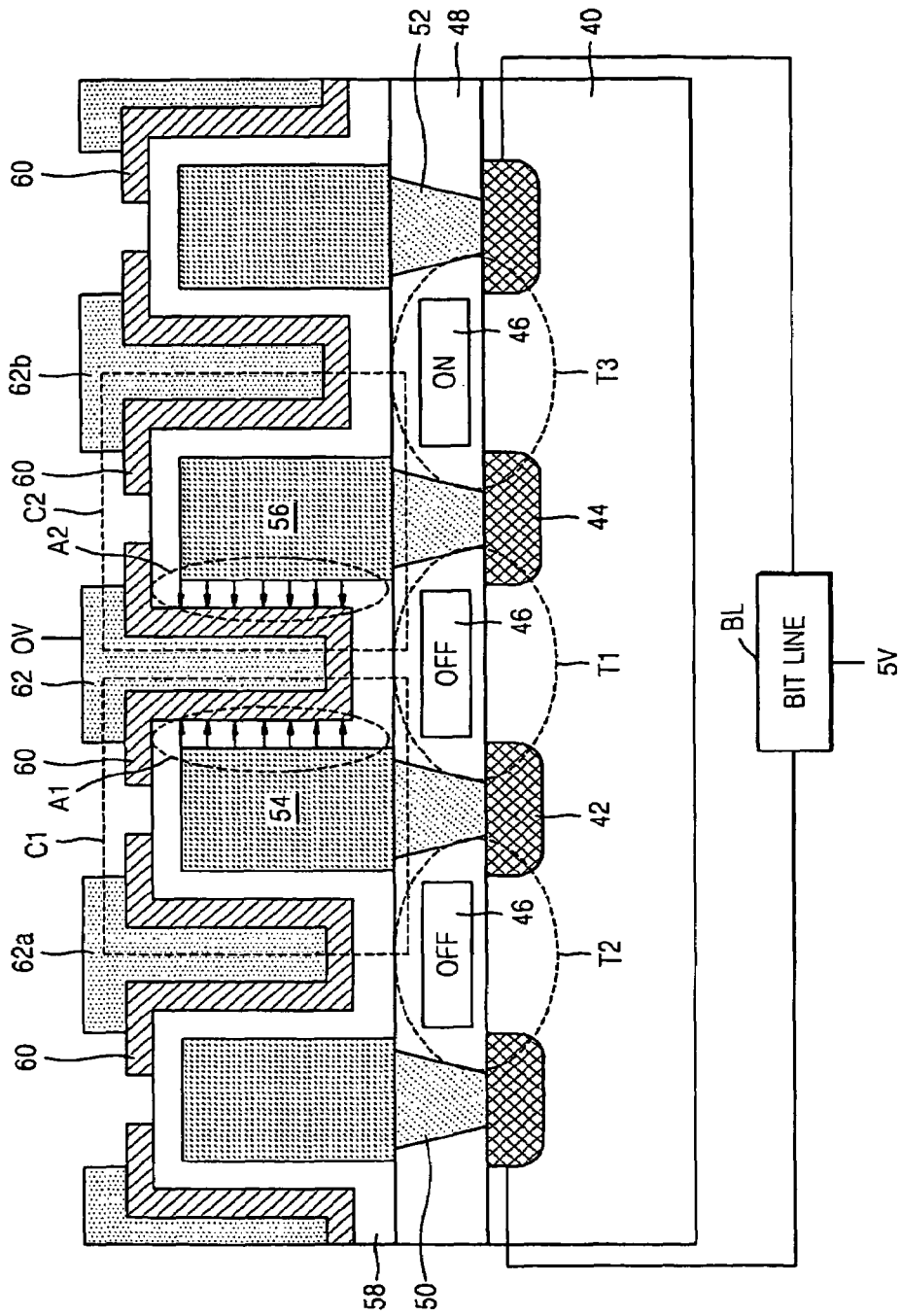

FIGS. 12-13 illustrate an example in which 2 bits of data are written to a first capacitor C1 and a second capacitor C2 connected respectively to the source region 42 and drain region 44 of a first transistor T1 in the NAND memory device 64 of FIG. 3. It is assumed that the first and second capacitors C1 and C2 are ferroelectric capacitors.

In FIG. 12, the first transistor T1 and third transistor T3 are turned off, and the second transistor T2 is turned on. A voltage for the write operation, for example, approximately 5 V, is supplied to a bit line BL, and a ground voltage, for example, approximately 0 V, is supplied to a plate line 62 between the first capacitor C1 and the second capacitor C2 of the first transistor T1. Other plate lines 62a and 62b are not supplied with a voltage. That is, the other plate lines 62a and 62b are floated. An electric potential difference is generated between a first bottom electrode 54 and a top electrode 60 of the first transistor T1. The electric potential difference is generated at a first region A1 of the dielectric layer 58. Accordingly, the first portion A1 of the dielectric layer 58 is polarized in a first direction. When the first region A1 of the dielectric layer 58 is polarized as described above, it is considered that data, e.g., '1' is written to the first region A1.

After this write operation, as illustrated in FIG. 13, the first transistor T1 is kept off, the second transistor T2 is turned off and the third transistor T3 is turned on. At this time, the voltages supplied to the bit line BL and the plate line 62 are maintained, e.g., the same as the above. Except for the plate line 62, the other plate lines 62a and 62b are floated. As a result, an electric potential difference is generated between the second bottom electrode 56 and the top electrode 60 of the first transistor T1. The electric potential difference is generated at a second region of the dielectric layer 58, and thus second region A2 of the dielectric layer 58 is polarized in a second direction at least substantially antiparallel to the first direction. This polarization direction of the second region A2 of the dielectric layer 58 is illustrated in FIG. 13. When the second region A2 of the dielectric layer 58 is polarized as shown in FIG. 13, it is considered that data, e.g., '1' is written to the second region A2. When the first region A1 of the dielectric layer 58 has the second polarization direction and/or the second region A2 of the dielectric layer 58 has the first polarization direction, it is considered that data, e.g., '0' is written in the first region A1 and/or the second region A2. This result may be obtained when the bit line BL is supplied with approximately, e.g., 0 V and the plate line 62 is supplied with a voltage for the write operation, for example, approximately 5 V.

Figure 14:
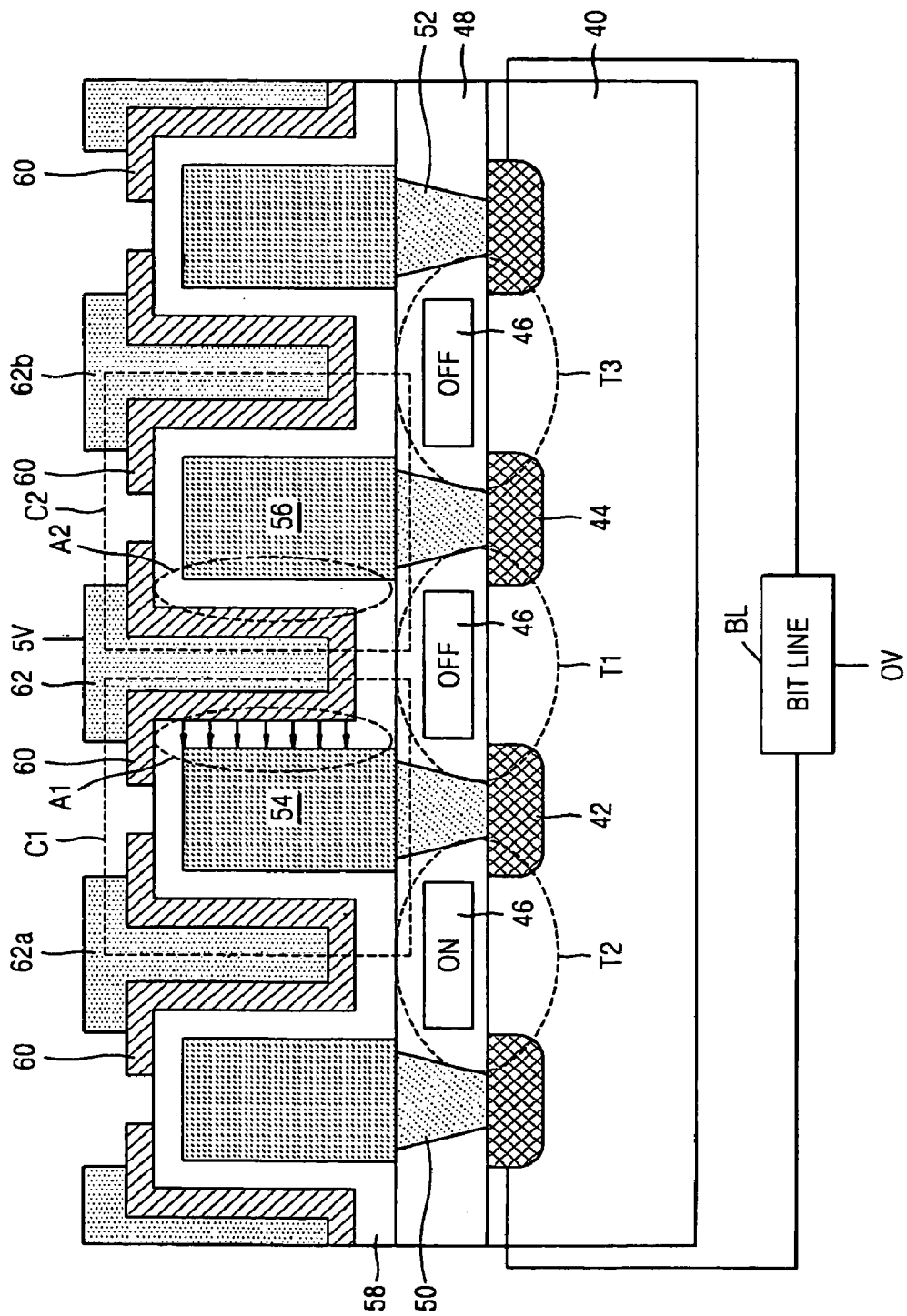
Figure 15:
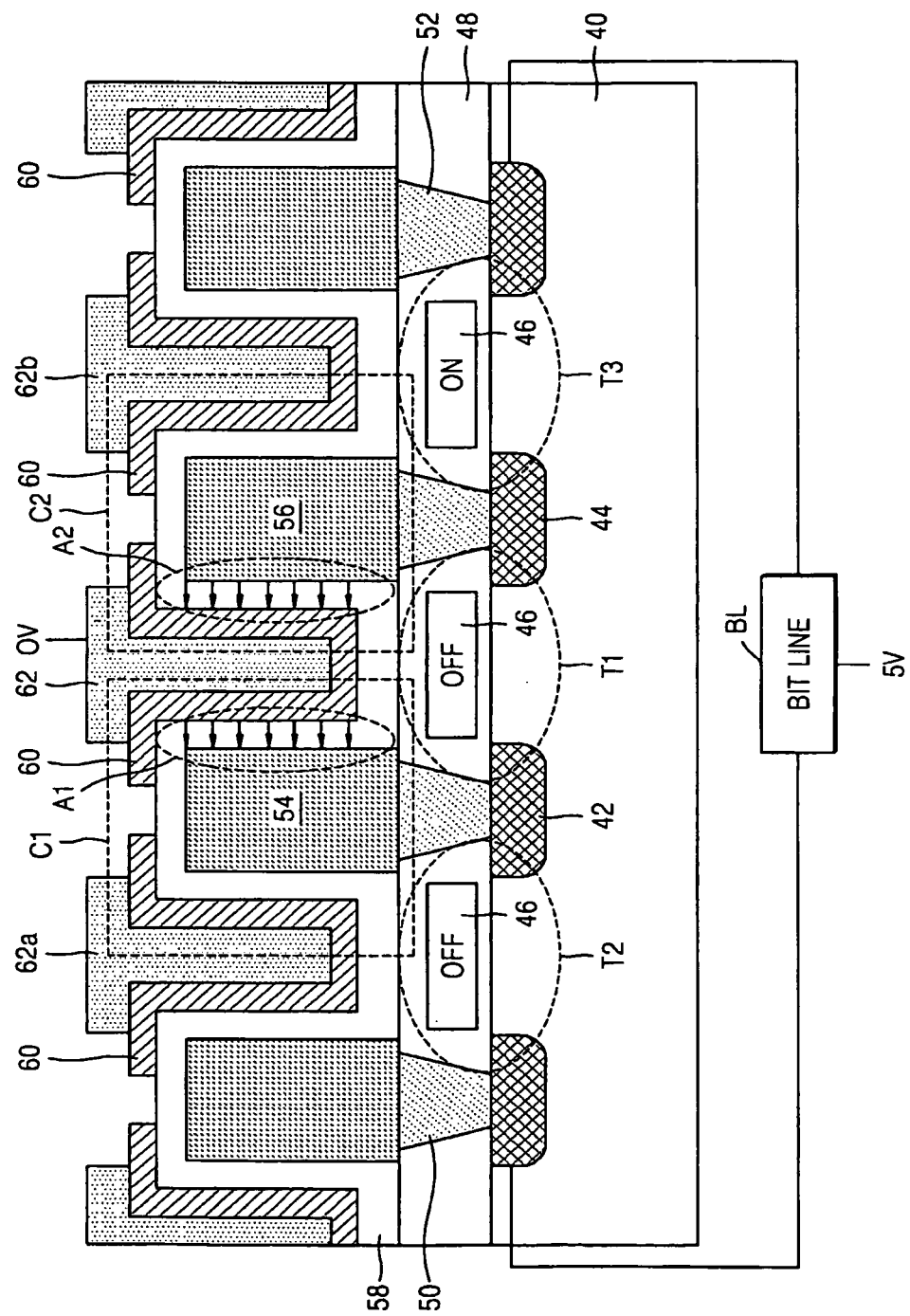

FIGS. 14 and 15 illustrate an example in which two bits of data '01' are written to the memory device 64 of FIG. 3 (including a first capacitor C1, a second capacitor C2 and a first transistor T1) (hereinafter referred to as a 2-bit memory device). FIG. 14 illustrates the operation of writing data '0' to a first region A1 of a dielectric layer 58, and FIG. 15 illustrates the operation of writing data '1' to a second region A2 while data '0' is maintained at the first region A1. Similarly, the above-described operating method can be used to write two bits of data in the patterns '10' and '00' to the 2-bit memory device, respectively.

When the first and second capacitors C1 and C2, which are storage nodes of the 2-bit memory device, are storage nodes of PRAM, the write operation can be, e.g., identical except for the magnitude and direction of the supplied current.

A read operation will now be described.

When the first and second capacitors C1 and C2 are used as storage nodes, the read operation of 2 bits of data written to the 2-bit memory device can be, e.g., identical to that of a FRAM. For example, a voltage for the read operation, e.g., approximately 5 V, is supplied to the plate line 62, and approximately 0 V is supplied to the bit line BL. At this time, the polarization direction corresponding to the data '0' (i.e., the polarization of the first region A1 of the dielectric layer 58 in FIG. 14) does not change. However, the polarization direction corresponding to the data '1' (i.e., the polarization of the first and second regions A1 and A2 of the dielectric layer 58 in FIG. 13) is inverted. Hence, after reading the data '1', a voltage opposite to the read voltage is supplied to revert the polarization to its state before the read operation.

Figure 16:
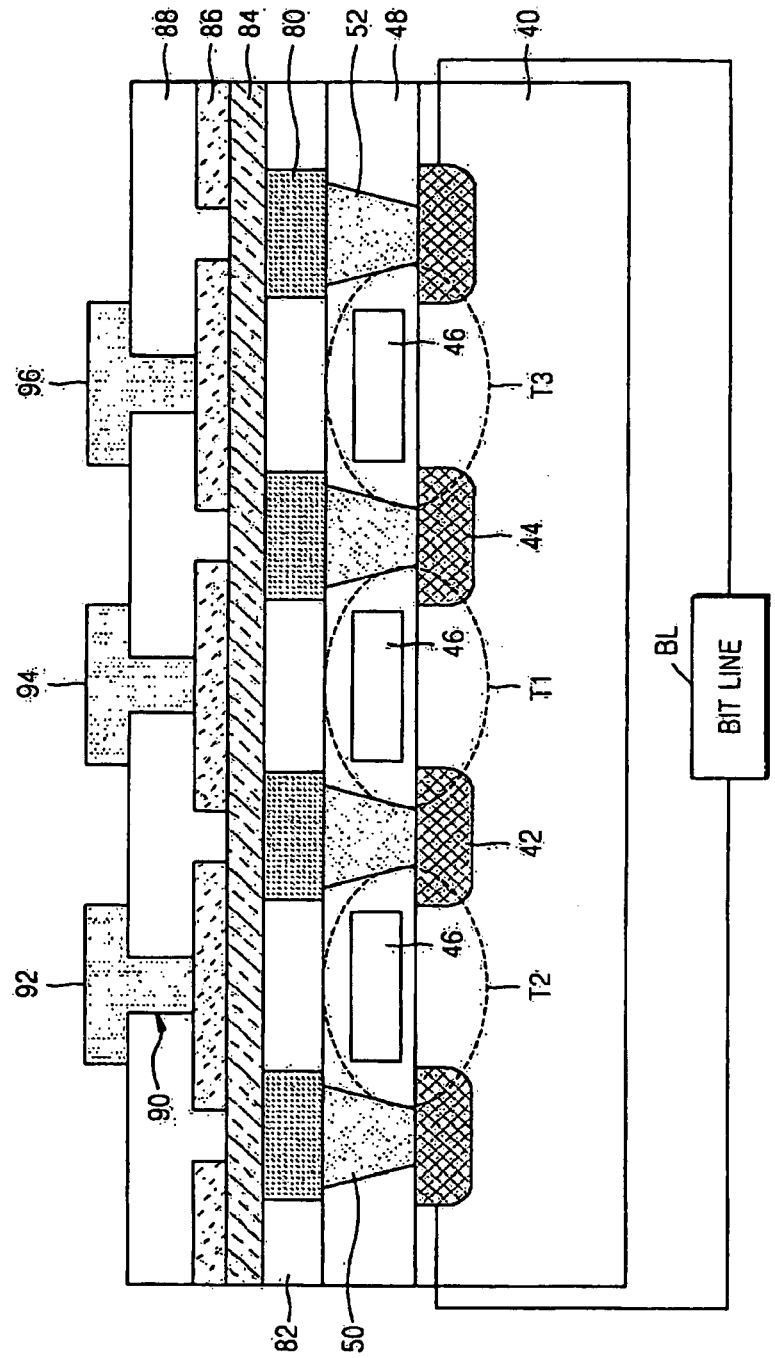
FIG. 16 is a sectional view of a memory device with a dual storage node according to an example embodiment of the present invention.

Another semiconductor memory device will now be described. FIG. 16 is a sectional view of a memory device 78 with a dual storage node according to an example embodiment of the present invention. Elements identical to those discussed above will not be described.

Referring to FIG. 16, a plurality of bottom electrodes 80 are formed on an interlayer insulating layer 48, covering the first and second conductive plugs 50 and 52. A first insulating layer 82 fills the spaces between the bottom electrodes 80. A storage node layer 84 covering the bottom electrodes 80 is formed on the first insulating layer 82.

The storage node layer 84 may be a storage node layer, e.g., of a PRAM or a RRAM. More specifically, the storage node layer 84 may include, e.g., a material whose resistance changes with current or a phase change layer whose resistance differs before and after the phase of its local region is changed. The storage node layer 84 may include, e.g., a material having a minimum resistance higher than the resistance of the first transistor T1, the second transistor T2 or the third transistor T3 when the same are turned on, respectively. For example, the minimum resistance of the material may be approximately 100 times higher than the resistance of the first transistor T1, the second transistor T2 or the third transistor T3. Since the characteristics of the storage node layer 84 are not related to the surface area, increasing the surface area is unnecessary, unlike for the capacitor. Accordingly, the storage node layer 84 with a flat structure or a slightly curved three-dimensional structure is sufficient.

A plurality of top electrodes 86 are formed on the storage node layer 84. At this time, each of the top electrodes 86 corresponds to or shares two bottom electrodes 80. That is, the top electrodes 86 and the bottom electrodes 80 are staggered so that one edge of each top electrode 86 overlaps a first bottom electrode 80, while the other edge of each top electrode 86 overlaps a neighboring second bottom electrode 80. From the point of view of the bottom electrodes 80, one bottom electrode 80 corresponds to or shares two top electrodes 86.

Second insulating layers 88 are formed to cover the top electrodes 86 and otherwise exposed portions of the storage node layer 84 therebetween. A plurality of via holes 90 exposing the top electrodes 86 are formed in the second insulating layer 88. A plurality of plate lines 92, 94 and 96 are formed on the second insulating layer 88, filling the via holes 90. The plate lines 92, 94 and 96 are perpendicular to a bit line BL and parallel to a word line (not shown).

In the case of the memory device 78 illustrated in FIG. 16, the read operation may be performed according to the read operation of a PRAM or a RRAM depending, e.g., on the material of the storage node layer 84.

Figure 17:
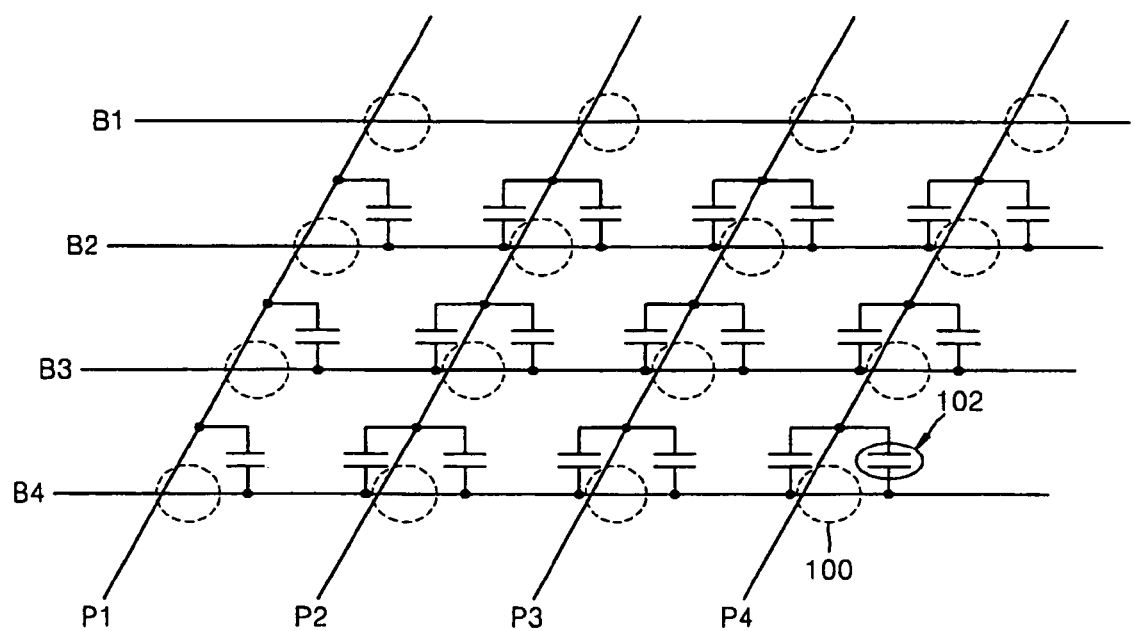
FIG. 17 is an equivalent circuit diagram of the semiconductor memory device with a dual storage node in FIG. 16.

FIG. 17 is a diagram showing an equivalent circuit relative to the memory device 78 of FIG. 16.

In FIG. 17, reference numerals b1 to b4 and P1 to P4 respectively represent bit lines and plate lines. Reference numeral 102 denotes a storage node. Although the storage node is expressed as a capacitor for the sake of convenience, the storage node may also include a material, e.g., whose resistance changes with current or a phase change layer whose resistance differs before and after the phase of its local region is changed, etc., as explained in FIG. 16. A dotted circle 100 in FIG. 17 represents a region where a transistor is formed. For simplicity, no reference numeral has been given to the transistor.

When the storage nodes 102 in FIG. 17 correspond to the storage node layer 84 illustrated in FIG. 16, then the minimum resistance (hereinafter referred to as the node resistance) of the selected storage node 102, e.g., is higher than the resistance of the corresponding transistor which is turned on, at the transistor region 100, in order to reduce (if not minimize) the chance of interference from other storage nodes during the read operation. For example, the node resistance can be approximately 100 times higher than the transistor resistance.

According to one or more embodiments of the present invention, a memory device includes one transistor and two storage nodes. One of the two storage nodes is connected to a source region of the transistor, while the other storage node is connected to a drain region thereof. The two adjacent transistors sharing the source region share the storage node connected to the source region. The two adjacent transistors sharing the drain region share the storage node connected to the drain region. This configuration is equivalent to the configuration of a semiconductor memory device including a ferroelectric capacitor, wherein the ferroelectric capacitor is separated into two parts, which are then connected respectively to the source region and the drain region. According to one or more additional embodiments of the present invention, the two-storage-node architecture of such a semiconductor memory device may be used within a structure similar to a NAND memory device, wherein a plurality of transistors are connected to one bit line.

Accordingly, compared with the conventional semiconductor memory device including one transistor and one storage node, the integration scale of a semiconductor memory device according to one or more embodiments of the present invention can be improved, and multi-bits can be written in each unit cell.

While the present invention has been particularly shown and described with reference to example embodiments thereof, it will be understood by those of ordinary skill in the art that various changes in form and detail may be made therein without departing from the spirit and scope of the present invention as defined by the following claims. For example, those skilled in the art are able to form a dielectric layer which is discontinuous, beneath a plate line and a first capacitor and a second capacitor, in various ways, or to form a bit line above the plate line. Hence, the scope of the present invention should not be defined by the example embodiments but by the following claims.

What is claimed is:

1. An operating method of a semiconductor memory device, the semiconductor memory device including a substrate, a first transistor formed on the substrate, a first storage node connected to a source region of the first transistor, a second storage node connected to a drain region of the first transistor, and a plate line commonly contacting the first storage node and the second storage node, the operating method comprising:

floating the drain region while maintaining the first transistor turned off; and generating a first electric potential difference between the source region of the first transistor and the plate line.

2. The operating method of claim 1, further comprising, after the generating of the first electric potential difference: floating the source region while maintaining the first transistor turned off; and generating a second electric potential difference between the drain region and the plate line.

3. The operating method of claim 2, wherein the second electric potential difference is generated by supplying a write voltage to the drain region and approximately 0 V to the plate line.

4. The operating method of claim 2, wherein the second electric potential difference is generated by supplying approximately 0 V to the drain region and a write voltage to the plate line.

5. The operating method of claim 1, wherein the first electric potential difference is generated by supplying a write voltage to the source region and approximately 0 V to the plate line.

6. The operating method of claim 1, wherein the first electric potential difference is generated by supplying approximately 0 V to the source region and a write voltage to the plate line.

7. The method of claim 1, wherein the first and the second storage nodes are one of capacitors and ferroelectric capacitors.

8. The operating method of claim 1, wherein the first and the second storage nodes are one of PRAM storage nodes and RRAM storage nodes.

9. The operating method of claim 8, wherein the first and second storage nodes include a material having a minimum resistance higher than the resistance of the first transistor when turned on.

10. The operating method of claim 1, further comprising:
 a second transistor sharing the source region and the first storage node; and
 a third transistor sharing the drain region and the second storage node.

* * * * *